(12) United States Patent
Tsukishiro (10) Patent No.: US 7,482,830 B2
(45) Date of Patent: Jan. 27, 2009

(54) SEMICONDUCTOR DEVICE AND METHOD FOR TESTING SEMICONDUCTOR DEVICE

(75) Inventor: Gen Tsukishiro, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/812,143

(22) Filed: Jun. 15, 2007

(65) Prior Publication Data

US 2007/0241767 A1   Oct. 18, 2007

Related U.S. Application Data

(63) Continuation of application No. 11/172,928, filed on Jul. 5, 2005, now Pat. No. 7,248,068.

(30) Foreign Application Priority Data

Mar. 29, 2005   (JP)   ............................. 2005-096162

(51) Int. Cl.
*G01R 31/26* (2006.01)

(52) U.S. Cl. ...................... 324/765; 324/763; 324/73.1
(58) Field of Classification Search ...................... None
See application file for complete search history.

(56) References Cited

U.S. PATENT DOCUMENTS

| 4,339,673 A | 7/1982 | Perry |
| 6,057,716 A | 5/2000 | Dinteman et al. |

*Primary Examiner*—Minh N Tang
(74) *Attorney, Agent, or Firm*—Arent Fox LLP

(57) ABSTRACT

A method for testing a semiconductor device incorporating a controller, which generates first and second complementary signals, and a memory, which operates in accordance with the first and second complementary signals. The method includes selectively switching the first and second complementary signals to an intermediate potential signal having an intermediate potential of the complementary signals. The method further includes conducting an operational test on the second device with the first and second complementary signals and the intermediate potential signal. This method enables detection of a defective connection between the devices.

7 Claims, 5 Drawing Sheets

SEMICONDUCTOR DEVICE AND METHOD FOR TESTING SEMICONDUCTOR DEVICE

CROSS-REFERENCE TO RELATED APPLICATIONS

This is a Continuation Application which claims the benefit of U.S. patent application Ser. No. 11/172,928, now U.S. Pat No. 7,248,068 filed Jul. 5, 2005, which also claims the benefit of priority from the prior Japanese Patent Application No. 2005-096162, filed on Mar. 29, 2005, the entire contents of which are incorporated herein by reference.

BACKGROUND OF THE INVENTION

The present invention relates to a semiconductor device, and more particularly to a method that is optimal for testing a semiconductor device, which uses complementary signal pairs, and a semiconductor device incorporating a tester circuit.

In recent years, there have been demands for further expansion of functions in semiconductor devices. Further, research has been made to develop semiconductor devices having higher integration levels, lower power consumption, and higher operation speeds. This has resulted in the popularity of a system-in-package (SiP) incorporating various devices, such as a CPU, a logic device, peripheral circuits, and a memory, in a single package.

To satisfy the demand for higher operation speeds, recent semiconductor devices include differential amplifiers used in input stages of devices to enable transmission of a small amplitude signal at a high frequency. A system such as SiP that incorporates a plurality of devices is also provided with such a differential amplifier. For example, in a memory system including a memory and a controller, the controller provides a pair of complementary clock signals to the memory. Then, a differential amplifier of the memory amplifies the complementary clock signals (synthesizes the signals) to generate a clock signal used in the memory system.

Figure 1:
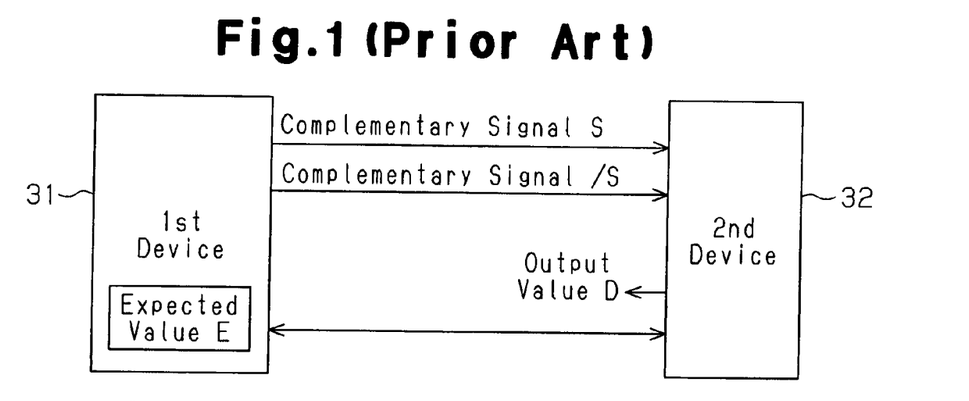
FIG. 1 is a schematic block diagram for illustrating a method for testing a semiconductor device with complementary signals in the prior art.

An operational test is conducted on the internal devices of such a system. As shown in FIG. 1, the operational test is conducted by providing a pair of complementary signals S and /S (symbol "/" indicates inversion) from a first device 31, which functions as a testing device, to a second device 32, which functions as a tested device. The first device 31 compares an output value D output by the second device 32 with an expected value E, which is the value expected as the output value D, to determine whether or not the second device 32 is operating normally. This determines whether or not there is a defective connection between the devices 31 and 32.

SUMMARY OF THE INVENTION

However, in the conventional test method described above, even if the line for providing the complementary signal S or the line for providing the complementary signal /S is broken between the devices 31 and 32, the second device 32 will operate in the same manner as it does when it is functioning normally (as when there are no defective connections). In such a case, defects in the lines for the complementary signals S and /S cannot be detected.

Figure 2A:
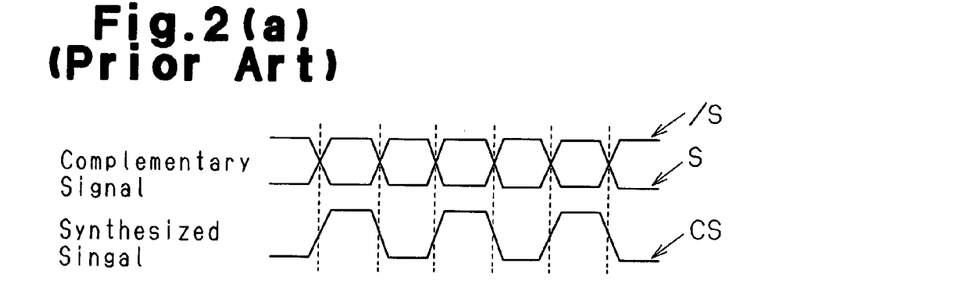
FIGS. 2(a) to 2(c) are waveform diagrams of synthesized signals generated during operational tests conducted on the semiconductor device of FIG. 1 in the prior art.

As shown in FIG. 2(a), when there is no defect in the lines for providing the complementary signals S and /S (during normal functioning), the second device 32 generates a synthesized signal CS based on the potential levels of the complementary signals S and /S. Specifically, the second device 32 generates an L level synthesized signal CS when the potential of the complementary signal /S is higher than that of the complementary signal S, and generates an H level synthesized signal CS when the potential of the complementary signal /S is lower than that of the complementary signal S.

Figure 2B:
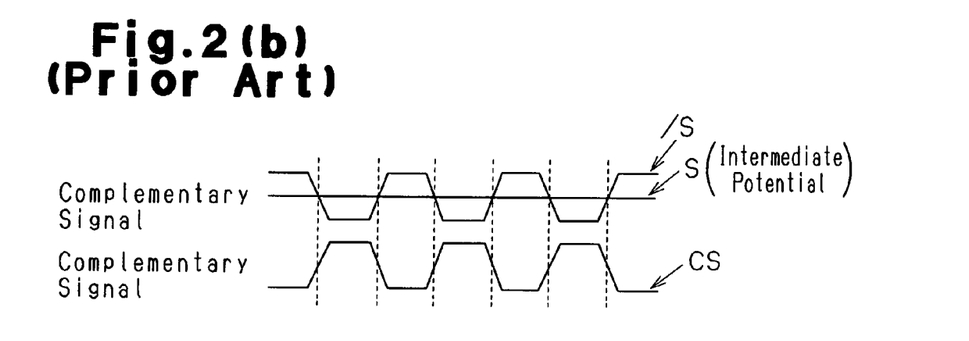

As shown in FIG. 2(b), if the line for providing the complementary signal S is broken, the output terminal for the complementary signal S of the first device 31 is set to high impedance, and the potential of the complementary signal S provided to the second device 32 is set to an intermediate potential of the other complementary signal /S. Accordingly, in this case, the second device 32 generates a synthesized signal CS in the same manner as during normal functioning (FIG. 2(a)).

Figure 2C:
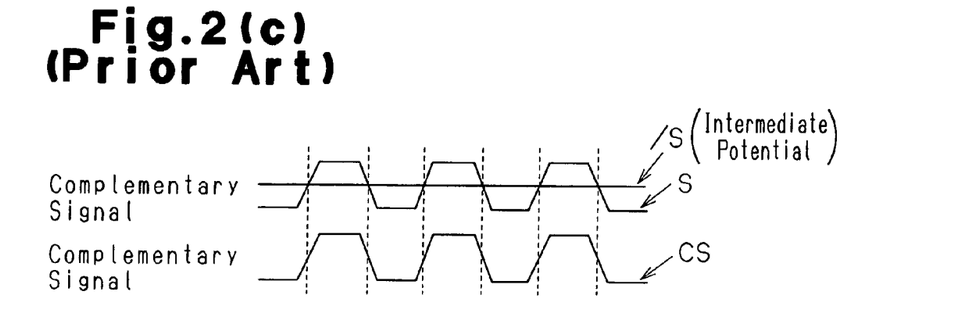

As shown in FIG. 2(c), if the line for providing the complementary signal /S is broken, the output terminal for the complementary signal /S of the first device 31 is set to high impedance, and the potential of the complementary signal /S provided to the second device 32 is set to an intermediate potential of the other complementary signal S. Therefore, in this case, the second device 32 also generates a synthesized signal CS in the same manner as during normal functioning (FIG. 2(a)).

In this manner, even if one of the complementary signals is broken in the conventional test method, the potential of that complementary signal is set to an intermediate potential of the other complementary signal. Thus, a synthesized signal is generated in the same manner as during normal functioning. As a result, even though there is a defective connection between the devices 31 and 32, it is erroneously determined that the entire system is functioning normally and the defective connection is not detected.

The present invention provides a semiconductor device and a method for testing a semiconductor device that are capable of detecting a defective connection between devices in an optimal manner.

One aspect of the present invention is a method for testing a semiconductor device incorporating a first device, which generates a first complementary signal and a second complementary signal that are complementary to each other, and a second device, which is connected to the first device and operates in accordance with the first and second complementary signals. The method includes selectively switching the first and second complementary signals to an intermediate potential signal having an intermediate potential of the first and second complementary signals, and conducting an operational test on the second device with the intermediate potential signal and one of the first and second complementary signals.

Another aspect of the present invention is a method for testing a semiconductor device incorporating a first device, which generates a first complementary signal and a second complementary signal that are complementary to each other, and a second device, which is connected to the first device and operates in accordance with the first and second complementary signals. The method includes conducting an operational test on the second device with the first complementary signal and an intermediate potential signal, which is used in lieu of the second complementary signal. The method further includes conducting an operational test on the second device with the second complementary signal and an intermediate potential signal, which is used in lieu of the first complementary signal.

A further aspect of the present invention is a semiconductor device including a first device for generating a first complementary signal and a second complementary signal that are complementary to each other. A second device connected to the first device operates in accordance with the first and second complementary signals. A tester circuit selectively switches the first and second complementary signals to an intermediate potential signal having an intermediate potential of the first and second complementary signals to conduct an operational test on the second device with the intermediate potential signal and one of the first and second complementary signals.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A semiconductor device 1 incorporating a tester circuit according to a preferred embodiment of the present invention will now be described with reference to the drawings.

Figure 3:
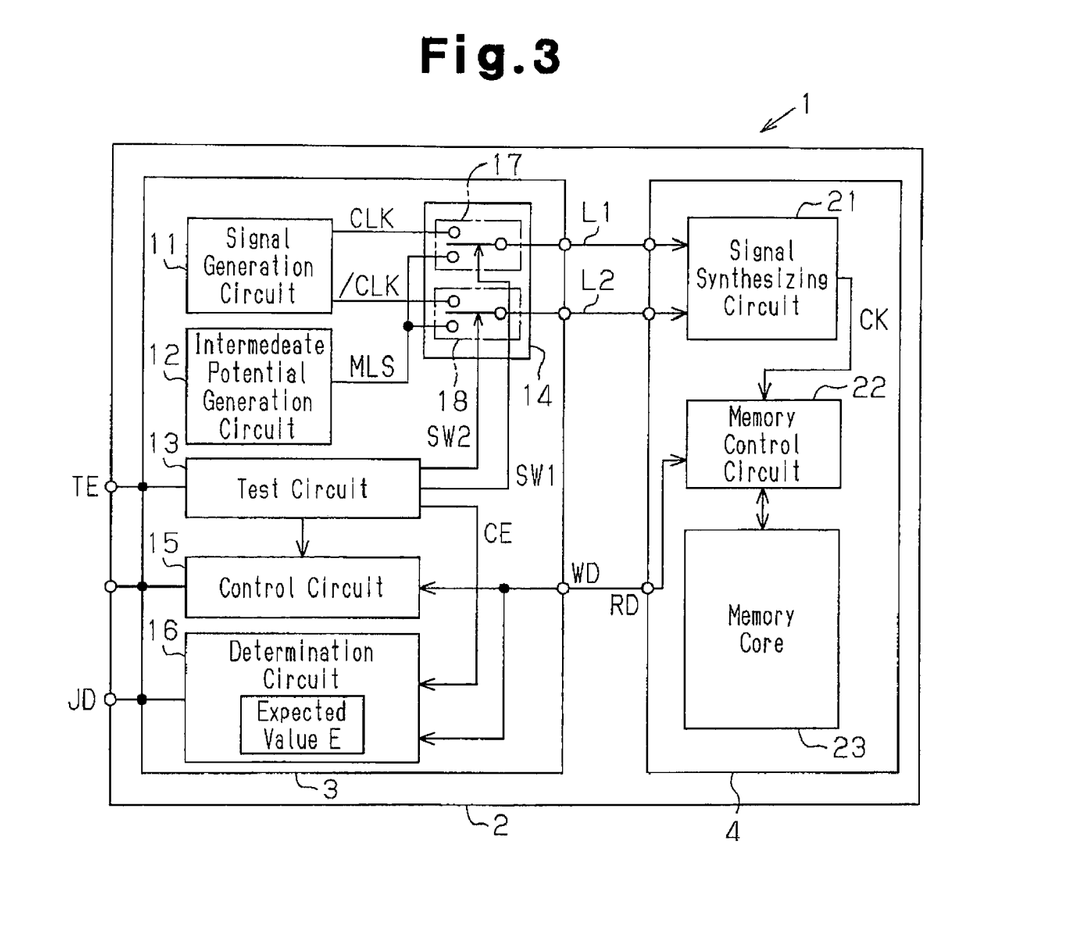
FIG. 3 is a schematic block diagram showing a semiconductor device incorporating a tester circuit according to a preferred embodiment of the present invention.

As shown in FIG. 3, the semiconductor device 1 is a memory system configured by a system-in-package (SiP), or package 2. The package 2 includes a controller 3, which functions as a first device, and a memory 4, which functions as a second device. The controller 3 and the memory 4 are connected to each other by wires in the package 2. Internal devices incorporated in the system are not limited to the controller and the memory and other devices may be incorporated as well. In the preferred embodiment, the internal devices (the controller 3 and the memory 4) are connected to each other in the package 2 so as to configure an SiP. However, the devices may be connected to each other in other manners such as by connecting the devices on a board.

The configuration of the controller 3, or the first device, will now be described.

The controller 3 includes a signal generation circuit 11, an intermediate potential generation circuit 12, a test circuit 13, a signal switching circuit 14, a control circuit 15, and a determination circuit 16. In the present embodiment, a tester circuit is configured by the intermediate potential generation circuit 12, the test circuit 13, the signal switching circuit 14, and the determination circuit 16.

The signal generation circuit 11 has a crystal oscillator (not shown) and generates a pair of complementary clock signals CLK and /CLK (the symbol "/" represents inversion), which function as first and second complementary signals that are complementary to each other. The complementary clock signal /CLK has a phase reversed from that of the complementary clock signal CLK.

The intermediate potential generation circuit 12 generates an intermediate potential signal MLS, which has an intermediate potential of the amplitude of the complementary clock signals CLK and /CLK. The intermediate potential signal MLS is generated through any of various methods known in the art. In the preferred embodiment, referring to FIG. 4, the intermediate potential signal MLS is generated by dividing an external power supply voltage VDD with resistors R1 and R2.

The test circuit 13 enters a test mode in response to a test mode signal TE from an external device. Based on the test mode signal TE, the test circuit 13 generates switch signals SW1 and SW2, for controlling switching in the signal switching circuit 14, and an activation signal CE, for activating the determination circuit 16.

The signal switching circuit 14 includes a first switch circuit 17 and a second switch circuit 18. The first switch circuit 17 has a first input terminal for receiving the complementary clock signal CLK and a second input terminal for receiving the intermediate potential signal MLS. In response to the switch signal SW1 from the test circuit 13, the first switch circuit 17 outputs the complementary clock signal CLK or the intermediate potential signal MLS from its output terminal. The second switch circuit 18 has a first input terminal for receiving the complementary clock signal /CLK and a second input terminal for receiving the intermediate potential signal MLS. In response to the switch signal SW2 from the test circuit 13, the second switch circuit 18 outputs the complementary clock signal /CLK or the intermediate potential signal MLS from its output terminal.

During the test mode, if the first switch circuit 17 of the signal switching circuit 14 selects the complementary clock signal CLK in response to the switch signal SW1, the second switch circuit 18 selects the intermediate potential signal MLS in response to the switch signal SW2. On the other hand, if the first switch circuit 17 selects the intermediate potential signal MLS in response to the switch signal SW1, the second switch circuit 18 selects the complementary clock signal /CLK in response to the switch signal SW2. Thus, in the test mode, either the combination of the complementary clock signal CLK and the intermediate potential signal MLS or the combination of the complementary clock signal /CLK and the intermediate potential signal MLS is output from the signal switching circuit 14. In a normal mode (when the semiconductor device 1 is not operating in the test mode), the complementary clock signals CLK and /CLK are output by the signal switching circuit 14 in accordance with the switch signal SW1 and SW2.

In the preferred present embodiment, the control circuit 15 functions as a read/write control circuit for controlling the write of data to and the reading of data from the memory 4. For example, when writing data to the memory 4, the control circuit 15 issues a write command to the memory 4 and provides a write address and write data WD to the memory 4. When reading data, the control circuit 15 issues a read command to the memory 4 and provides a read address to the memory 4. In this manner, read data RD is read from the memory 4. In the test mode, the control circuit 15 accesses the memory 4 in response to a control signal from the test circuit 13.

The determination circuit 16 is activated by the activation signal CE from the test circuit 13 and compares an output value from the memory 4 (in the preferred embodiment, the read data RD read from the memory 4) with an expected value E of the read data RD to generate a comparison result signal JD.

The configuration of the memory 4, or the second device, will now be described.

The memory 4 includes a signal synthesizing circuit 21, a memory control circuit 22, and a memory core 23.

The signal synthesizing circuit 21 is configured by a differential amplifier. The signal synthesizing circuit 21 has a first terminal and a second terminal for receiving two signals from the controller 3 via lines L1 and L2, respectively. The signal synthesizing circuit 21 generates a synthesized signal CK based on the potentials of the two signals. Specifically, when the potential of the signal provided to the second terminal is higher than that of the signal provided to the first terminal, the signal synthesizing circuit 21 generates an L (low) level synthesized signal CK. When the potential of the signal provided to the second terminal is lower than that of the signal provided to the first terminal, the signal synthesizing circuit 21 generates an H (high) level synthesized signal CK.

When the complementary clock signal CLK and the intermediate potential signal MLS are provided from the controller 3 through the signal switching circuit 14 during the test mode, the signal synthesizing circuit 21 receives the complementary clock signal CLK at the first terminal and the intermediate potential signal MLS at the second terminal. If the potential of the intermediate potential signal MLS is higher than that of the complementary clock signal CLK, the signal synthesizing circuit 21 generates an L level synthesized signal CK. If the potential of the intermediate potential signal MLS is lower than that of the complementary clock signal CLK, the signal synthesizing circuit 21 generates an H level synthesized signal CK.

When the complementary clock signal /CLK and the intermediate potential signal MLS are provided from the controller 3 through the signal switching circuit 14 in the test mode, the signal synthesizing circuit 21 receives the intermediate potential signal MLS at the first terminal and the complementary clock signal /CLK at the second terminal. If the potential of the complementary clock signal /CLK is higher than that of the intermediate potential signal MLS, the signal synthesizing circuit 21 generates an L level synthesized signal CK. If the potential of the complementary clock signal /CLK is lower than that of the intermediate potential signal MLS, the signal synthesizing circuit 21 generates an H level synthesized signal CK.

During the normal mode, the signal synthesizing circuit 21 receives the complementary clock signal CLK at the first terminal and the complementary clock signal /CLK at the second terminal. When the potential of the complementary clock signal /CLK is higher than that of the complementary clock signal CLK, the signal synthesizing circuit 21 generates an L level synthesized signal CK. When the potential of the complementary clock signal /CLK is lower than that of the complementary clock signal CLK, the signal synthesizing circuit 21 generates an H level synthesized signal CK.

The memory control circuit 22 receives the synthesized signal CK as a clock input. The control circuit 15 of the controller 3 controls the memory control circuit 22 to write data to and read data from the memory core 23. The memory core 23 includes a memory cell array having a plurality of memory cells arranged in an array, a column decoder, a row decoder, and the like (not shown).

A method for testing the semiconductor device 1 will now be described.

The semiconductor device 1 is tested by operating the memory 4 in the test mode in response to the test mode signal TE. Then, the controller 3 compares an output value of the memory 4 (read data RD of the write data WD) with an expected value E of the output value. In the present embodiment, the semiconductor device 1 is tested in two steps, a first test step and a second test step.

In the first test step, the controller 3 conducts an operational test on the memory 4 by providing the intermediate potential signal MLS and the complementary clock signal /CLK to the memory 4 via the lines L1 and L2, respectively.

The controller 3 executes the first test step to compare an output value (read data RD) of the memory 4 with an expected value E of the output value and generates a comparison result signal JD indicating the comparison result. The operation of the memory 4 is checked based on the comparison result signal JD.

In the second test step, the controller 3 conducts an operational test on the memory 4 by providing the complementary clock signal CLK and the intermediate potential signal MLS to the memory 4 via the lines L1 and L2, respectively.

After checking the operation of the memory 4 in the first test step, the controller 3 subsequently executes the second test step and compares an output value (read data RD) of the memory 4 with the expected value E of the output value to generate the comparison result signal JD. The operation of the memory 4 is checked based on the comparison result signal JD.

During the test mode, the first and second test steps are executed to check the operation of the memory 4 and determine whether there is a defect in the lines L1 and L2 that respectively provide complementary clock signals CLK and /CLK from the controller 3 to the memory 4.

Figure 5A:
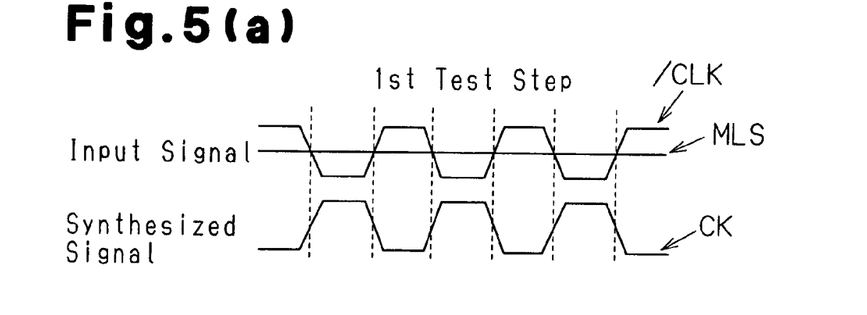
FIGS. 5(a) and 5(b) are waveform diagrams of synthesized signals generated during operational tests when there is no defect in a set of lines between a controller and a memory of the semiconductor device of FIG. 3.
Figure 5B:
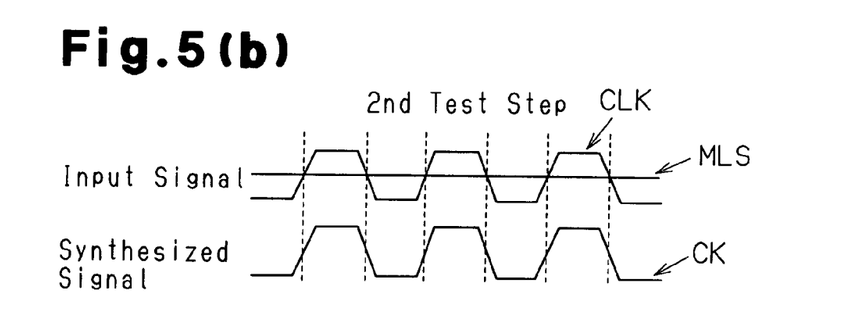
Figure 6A:
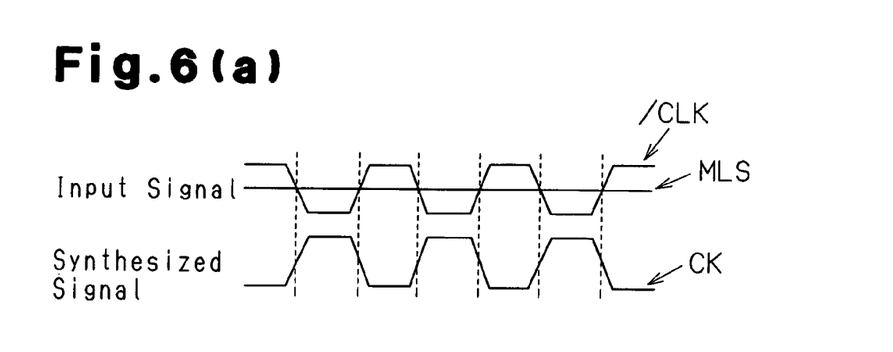
FIGS. 6(a) and 6(b) are waveform diagrams of synthesized signals generated during operational tests when there is a defect in one of the lines between the controller and the memory of the semiconductor device of FIG. 3.
Figure 6B:
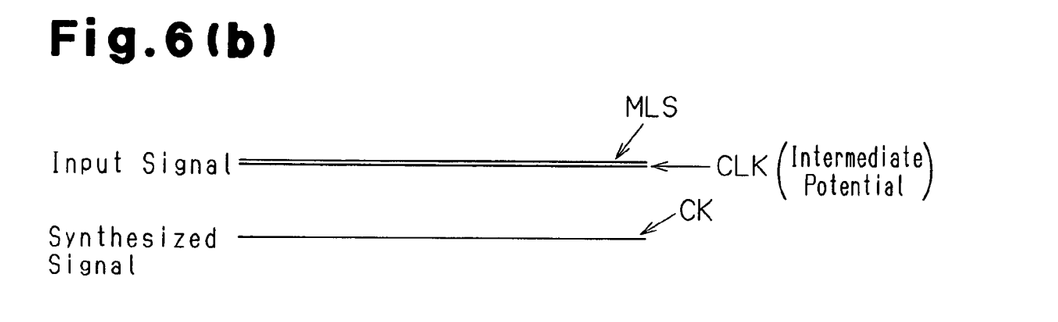
Figure 7A:
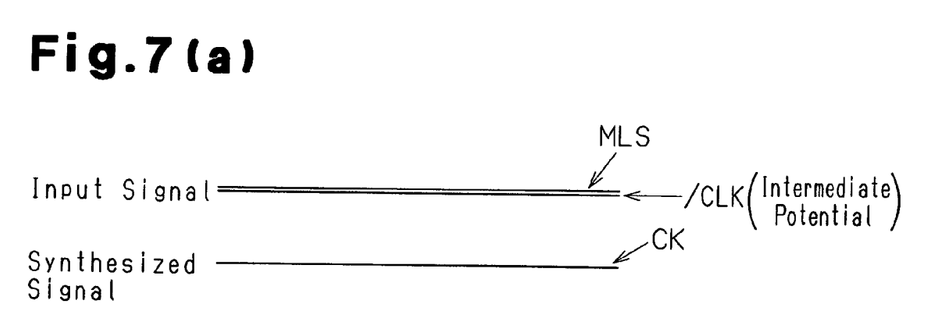
FIGS. 7(a) and 7(b) are waveform diagrams of synthesized signals generated during operational tests when there is a defect in the other one of the lines between the controller and the memory of the semiconductor device of FIG. 3.
Figure 7B:
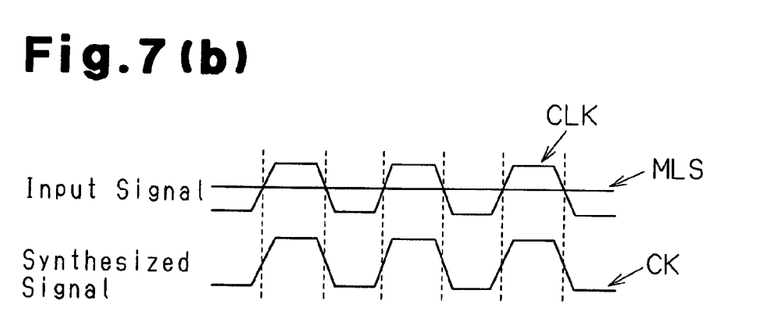

FIGS. 5 to 7 are waveform diagrams of the synthesized signal CK generated by the memory 4 in the test method of the preferred embodiment. FIG. 5 is a waveform diagram of the synthesized signal CK when there is no defect in the lines L1 and L2 (during normal functioning). FIG. 6 is a waveform diagram of the synthesized signal CK when there is a defect in the line L1. FIG. 7 is a waveform diagram of the synthesized signal CK when there is a defect in the line L2.

An example in which there is no defective connection (normal functioning) will first be described.

As shown in FIG. 5(a), in the first test step, the intermediate potential signal MLS and the complementary clock signal /CLK are provided from the controller 3 to the memory 4. In this state, there is no defect in the line L2, which provides the complementary clock signal /CLK. Accordingly, the signal synthesizing circuit 21 of the memory 4 generates the synthesized signal CK in the same manner as during the normal mode. Thus, if it is verified in the first test step that the memory 4 is operating normally, the connection of the line L2 is determined as being normally connected.

Subsequently, as shown in FIG. 5(b), in the second test step, the complementary clock signal CLK and the intermediate potential signal MLS are provided from the controller 3 to the memory 4. In this state, there is no defect in the line L1, which provides the complementary clock signal CLK to the memory 4. Accordingly, the signal synthesizing circuit 21 generates the synthesized signal CK in the same manner as during the normal mode. Thus, if it is verified in the second test step that the memory 4 is operating normally, the connection of the line L1 is determined as being normally connected.

Next, an example in which the line L1 is defective will be described.

If the line L1 is defective, as shown in FIG. 6(b), the potential of the complementary clock signal CLK provided to the memory 4 in the second test step is set to an intermediate potential (potential that is substantially the same as the intermediate potential signal MLS). In this case, the generated synthesized signal CK has the intermediate potential, and the memory 4 thus does not operate normally. Consequently, it is determined that the line L1 is defective. In this case, during the first test step (FIG. 6(a)), the synthesized signal CK is generated in the same manner as in the normal state (FIG. 5(a)) since there is no defect in the line L2.

Next, an example in which the line L2 is defective will be described.

If the line L2 is defective, as shown in FIG. 7(a), the potential of the complementary clock signal /CLK provided to the memory 4 in the first test step is set to an intermediate potential (potential that is substantially the same as the intermediate potential signal MLS). In this case, the generated synthesized signal CK has the intermediate potential, and the memory 4 thus does not operate normally. Consequently, it is determined that the line L2 is defective. In this case, during the second test step (FIG. 7(b)), the synthesized signal CK is generated in the same manner as in the normal state (FIG. 5(b)) since there is no defect in the line L1.

Although not shown in the drawings, when the lines L1 and L2 are both defective, the generated synthesized signal CK has the intermediate potential in both of the first and second test steps. As a result, the memory 4 does not operate normally in the first test step and in the second test step. It is thus determined that both of the lines L1 and L2 are defective.

The semiconductor device 1 of the preferred embodiment has the advantages described below.

(1) The connection between devices is tested in two steps. In the first test step, an operational test is conducted by setting one of the two complementary clock signals CLK and /CLK provided to the memory 4 to an intermediate potential. In the second test step, an operational test is conducted by setting the other one of the two complementary clock signals CLK and /CLK to an intermediate potential. In this test method, defects are separately detected in the lines L1 and L2 based on the results of the operational tests conducted in the first and second test steps.

(2) The test method is executed by providing the switch signals SW1 and SW2 from the test circuit 13 to perform switching in the signal switching circuit 14 and selectively output a complementary clock signal and an intermediate potential signal. The test method is executed in a simple manner with high accuracy.

(3) In response to the test mode signal TE, the controller 3 switches the signal provided to the memory 4 from the complementary clock signal CLK or the complementary clock signal /CLK to the intermediate potential signal MLS. Therefore, the test is conducted without any modification of the configuration of the memory 4.

(4) The intermediate potential generation circuit 12 for generating the intermediate potential signal MLS is arranged in the controller 3. Accordingly, there is no need for providing the controller 3 with an additional terminal for the test. Thus, the number of terminals does not have to be increased.

(5) The test mode signal TE is provided to conduct operational tests in the first and second test steps. It is then determined, based on the results of the operational tests (based on the comparison result signal JD), if there is a defective connection between the devices. Accordingly, even in a case when it is difficult to physically check the connection between the devices, highly accurate test results are obtained.

It should be apparent to those skilled in the art that the present invention may be embodied in many other specific forms without departing from the spirit or scope of the invention. Particularly, it should be understood that the present invention may be embodied in the following forms.

The potential of the intermediate potential signal MLS does not necessarily have to be the intermediate potential of the two complementary clock signals CLK and /CLK. However, it is preferred that, during the test mode, the intermediate potential signal MLS, which is output in lieu of the complementary clock signal CLK, have the intermediate potential of the complementary clock signal /CLK. Further, it is preferred that the intermediate potential of the intermediate potential signal MLS, which is output in lieu of the complementary clock signal /CLK, have the intermediate potential of the complementary clock signal CLK.

In the preferred embodiment, the output from the signal switching circuit 14 is switched based on the switch signals SW1 and SW2 from the test circuit 13. This configuration may be modified. For example, the signal generation circuit 11 may generate the complementary clock signals CLK and /CLK and the intermediate potential signal MLS. In this case, during the test mode, the signal generation circuit 11 sequentially outputs the complementary clock signal CLK and the intermediate potential signal MLS and then the complementary clock signal /CLK and the intermediate potential signal MLS in accordance with a signal from the test circuit 13.

The intermediate potential generation circuit 12 and the signal switching circuit 14 may be arranged in the memory 4 (the tested device), and the controller 3 may provide the pair of complementary clock signals CLK and /CLK to the memory 4. In this case, during the test mode, the signal switching circuit of the memory 4 receives the switch signals SW1 and SW2 from the test circuit 13 to select the signal provided to the signal synthesizing circuit 21. This configuration has the same advantages as the preferred embodiment. This modification is referred to as modification a1.

The intermediate potential generation circuit 12 may be eliminated. In this case, during the test mode, the intermediate potential signal MLS is provided from an external device. The intermediate potential generation circuit 12 is not necessary during the normal mode. Therefore, the elimination of the intermediate potential generation circuit 12 enables a decrease in the chip area. This modification will hereafter be referred to as modification b1.

Modification b1 may be combined with modification a1. More specifically, the signal switching circuit 14 may be arranged in the memory 4, and the intermediate potential signal MLS may be provided from an external device to the memory 4 via the controller 3. This configuration enables a decrease in the chip area of the memory 4 from that in modification a1.

The first and second complementary signals, which are complementary to each other, are not necessarily limited to the complementary clock signal CLK and /CLK. For example, when the memory 4 is a double data rate (DDR) memory, the present invention is applicable to a test for detecting a connection defect in lines for providing a pair of data strobe signals, which are used as signals for reading data.

Figure 4:
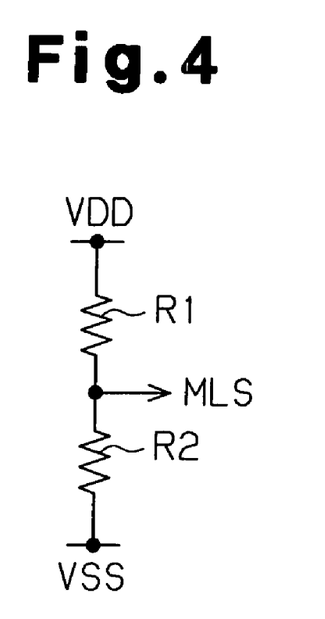
FIG. 4 is a schematic circuit diagram showing an intermediate potential generation circuit of the semiconductor device of FIG. 3.

The intermediate potential generation circuit 12 may be activated by the test circuit 13 only during the test mode. In this case, for example, a switching device may be connected in series to the resistor R1 and R2 so that the switching device is activated by a signal from the test circuit 13 only during the test mode.

The configuration of the tester circuit of the semiconductor device 1 is not limited to that of the preferred embodiment (FIG. 3). The tester circuit may have any configuration insofar as the operational test may be conducted on the memory 4 by switching each of the pair of complementary clock signals CLK and /CLK into the intermediate potential signal MLS having an intermediate potential of the complementary clock signals CLK and /CLK. If the intermediate potential signal MLS is provided from an external device to the semiconductor device 1, the tester circuit need only include the test circuit 13 and the signal switching circuit 14. Accordingly, the determination circuit 16 may be arranged in an external device. When the determination circuit 16 is arranged in an external device, an output value (read data RD) of the memory 4 is provided to the external device via the control circuit 15 so that the external device determines the operation of the semiconductor device 1.

The present invention is applicable not only to the memory system having the controller 3 and the memory 4 but also to a system provided with other various types of devices.

The present examples and embodiments are to be considered as illustrative and not restrictive, and the invention is not to be limited to the details given herein, but may be modified within the scope and equivalence of the appended claims.

What is claimed is:

1. A system comprising:
   a first semiconductor device that incorporates a signal generation circuit configured to generate a first signal and a second signal that are complementary to each other;
   a second semiconductor device, connected to the first semiconductor device and configured to operate in accordance with the first and second signals; and
   a tester circuit, mounted on either the first semiconductor device or the second semiconductor device, configured to selectively switch the first and second signals to an intermediate potential signal to conduct an operational test on the second semiconductor device with the intermediate signal and one of the first and second signals.

2. The system according to the claim 1, wherein the signal generation circuit is a clock signal generation circuit, the first signal is a first clock signal, and the second signal is a second clock signal that has a phase reversed from a phase of the first clock signal.

3. The system according to the claim 2, wherein the first semiconductor device is a controller and the second semiconductor device is a memory.

4. The system according to the claim 3, further comprising a differential amplifier incorporated in the second semiconductor device and coupled to receive the first and second clock signals to output an internal clock signal, wherein the second semiconductor device operates in response to the internal clock.

5. The system according to claim 4, wherein the first and second semiconductor devices are accommodated in a signal package.

6. A semiconductor controller comprising:
   a signal generation circuit configured to generate a first clock signal and a second clock signal that are complementary to each other and outputs the first and second clock signals to an external device in a normal operation mode for the external device; and
   a tester circuit configured to selectively switch the first and second clock signals to an intermediate potential signal to output the intermediate signal and one of the first and second signals in a test mode for the external device.

7. A method of testing a synchronous semiconductor memory device to produce a non-defective synchronous semiconductor memory device, the method comprising:
   generating a first clock signal and a second clock signal that are complementary to each other,
   outputting the first and second clock signals to the synchronous semiconductor memory device in a normal operation mode for the synchronous semiconductor memory device;
   selectively switching the first and second clock signals to an intermediate potential signal in a test mode; and
   outputting the intermediate signal and one of the first and second signals in the test mode for the synchronous semiconductor memory device.

* * * * *